United States Patent
Yoshida et al.

(10) Patent No.: US 8,107,813 B2
(45) Date of Patent: Jan. 31, 2012

(54) DRIVE CIRCUIT AND OPTICAL SWITCH

(75) Inventors: Setsuo Yoshida, Kawasaki (JP); Yutaka Kai, Kawasaki (JP); Masaji Noguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 458 days.

(21) Appl. No.: 12/320,439

(22) Filed: Jan. 26, 2009

(65) Prior Publication Data

US 2009/0297147 A1    Dec. 3, 2009

(30) Foreign Application Priority Data

May 29, 2008 (JP) .................................. 2008-141400

(51) Int. Cl.
*H04J 14/00* (2006.01)
*G02B 6/26* (2006.01)

(52) U.S. Cl. .......................................... 398/45; 385/16

(58) Field of Classification Search .................... 398/45, 398/51, 54; 385/16, 17, 24
See application file for complete search history.

(56) References Cited

FOREIGN PATENT DOCUMENTS

| JP | 2000-261508 | 9/2000 |
|----|-------------|--------|
| JP | 2001-154160 | 6/2001 |
| JP | 2005-208178 | 8/2005 |
| JP | 2006-254303 | 9/2006 |

*Primary Examiner* — Jack Dinh
(74) *Attorney, Agent, or Firm* — Staas & Halsey LLP

(57) ABSTRACT

A drive circuit includes a first transistor that is controlled to be in on or off state in response to a control signal, and outputs, in on state, a positive current which is input from a first operational amplifier connected with a drain of the first transistor to a semiconductor optical amplifier; and a second transistor that is connected with a source of the first transistor, and is in inverse on or off state to the state of the first transistor. The drive circuit also includes a negative voltage circuit that is connected to a source of the second transistor, and outputs, when the second transistor is in on state, a negative current to the semiconductor optical amplifier.

8 Claims, 10 Drawing Sheets

DRIVE CIRCUIT AND OPTICAL SWITCH

CROSS-REFERENCE TO RELATED APPLICATION(S)

This application is based upon and claims the benefit of priority of the prior Japanese Patent Application No. 2008-141400, filed on May 29, 2008, the entire contents of which are incorporated herein by reference.

FIELD

The embodiments discussed herein are directed to a drive circuit which drives an optical amplifier, and an optical switch.

BACKGROUND

In a field of optical communication network, to establish future multimedia network, there has been demand for an optical communication apparatus which provides high-speed communication with great capacity. To realize the high-speed communication with great capacity, an optical packet switching system using a high-speed optical switch which works on the order of nanoseconds (ns) has been researched and developed. An SOA (Semiconductor Optical Amplifier) with which high-speed switching on the order of nanoseconds is realized is expected to be applied to a matrix optical switch and the like in the optical packet switching system.

FIG. 3 depicts an illustration of the optical packet switching system. As depicted in FIG. 3, the optical packet switching system includes edge nodes 1 to 10, and core nodes 11 to 14. The edge nodes 1 to 10 are devices which relay optical packet signals transmitted between the optical packet switching network and other access networks.

The core nodes 11 to 14 have a matrix optical switch function which switches routes (optical routes) of the optical packet signals. FIG. 4 depicts a functional block diagram which depicts configuration of the conventional core node 11 (the core nodes 12 to 14 have the same configuration). As depicted in FIG. 4, the core node 11 includes wavelength converters 20 to 23, a matrix optical switch 24, a control unit (Reservation manager) 25, and an O/E/O (Optical to Electrical to Optical) converter 26.

Of the configuration above, the wavelength converters 20 to 23 convert the wavelength of the optical packet signal. The matrix optical switch 24 switches routes of the optical packet signals based on a control signal input from the control unit (Reservation manager) 25.

The control unit 25 controls the matrix optical switch 24 based on a label signal input from the O/E/O converter 26. The label signal includes route information of the optical packet signal.

The O/E/O converter 26 converts the optical signal input from an outside into an electrical signal, and outputs the label signal included in the converted signal to the control unit 25. After the O/E/O converter converts the electric signal back into the optical signal, the O/E/O converter 26 outputs the converted optical signal to an outside.

FIG. 5 depicts an illustration of switching timing of the optical packet signal. FIG. 5 schematically depicts the optical signal moving to right. As depicted in FIG. 5, the matrix optical switch 24 is switched at a certain interval offset time after the label signal. Switching the matrix optical switch needs to be completed during time between transit time (about ions; optical switch switching time) of an optical packet signal A and that of an optical packet signal B.

A configuration of the matrix optical switch 24 depicted in FIG. 4 is described. As depicted in FIG. 4, the matrix optical switch 24 includes division couplers 30a to 30c, multiplexing couplers 40a to 40c, and an SOA (an SOA-gate optical switch) 40.

Each of the division couplers 30a to 30c divides input optical packet signals, and each of the multiplexing couplers 40a to 40c multiplexes input optical signals. The SOA 40 switches a route of a desired optical packet signal by turning on or turning off drive current which is input from an outside.

The following describes a case in FIG. 6 where an optical packet signal #n which is input to an input port #1 of the division coupler 30a is output to an output port #n. The optical packet signal #n is divided into n signals at the division coupler 30a, and each of the divided n optical packet signals is input to each of the SOAs 40 corresponding to each of the output ports.

As the optical packet signal #n is output to the output port #n, one of the SOAs 40 receiving the output from the division coupler 30a, corresponding to the output port #n is turned on, whereas the other SOAs 40 corresponding to other output ports are turned off, whereby the optical packet signal #n is output from the input port #1 to the output port #n.

An operation of the SOA 40 depicted in FIG. 6 is described below. FIG. 7 depicts an illustration of the operation of the SOA 40. FIG. 7 depicts the SOA 40, and a drive circuit 45 which drives the SOA 40. Further, (a) in FIG. 7 is the optical packet signal which is input into the SOA 40, (b) in FIG. 7 is drive current supplied from the drive circuit 45 for the SOA 40, and (c) in FIG. 7 is the optical packet signal which is output to the SOA 40.

The control signal is input into the drive circuit 45. Based on the control signal, the drive circuit 45 outputs the drive current depicted by (b) in FIG. 7 to the SOA 40. As the drive current from the drive circuit 45 is applied to an optical-signal amplifying region, the SOA 40 amplifies the optical signal propagating the amplifying region. The SOA 40 is used as a gate device which turns the drive current on and off as depicted by (b) in FIG. 7.

For example, when the drive current of timing depicted by (b) in FIG. 7 is applied, the SOA 40 turns on the gate for the optical packet signals #1, #3 of the optical packet signals #1 to #3 depicted by (a) in FIG. 7, and turns off the gate for the optical signal #2. Accordingly, the SOA 40 outputs the optical packet signal depicted by (c) in FIG. 7.

A relation between the drive current and optical gain of the SOA 40 is described. FIG. 8 depicts the relation between the drive current and the optical gain of the SOA 40. The SOA 40 is a semiconductor optical amplifier which is configured such that the optical gain changes depending on the drive current. In FIG. 8, for example, when a drive current of 300 mA is applied, the optical gain becomes saturated at approximately 10 dB. On the other hand, when the drive current is low, the SOA 40 depicts optical attenuation characteristics.

A relation between the drive voltage and the optical gain of the SOA 40 is described. FIG. 9 depicts the relation between the drive voltage and the optical gain of the SOA 40. The SOA 40 is driven by current, and further, the SOA 40 may be driven by voltage by applying voltage thereto from voltage source which can apply a current of 300 mA or more. In FIG. 9, when about a voltage of 1.5 V is applied as voltage source, about a drive current of 300 mA is applied to the SOA. On the other hand, when the drive voltage is low, the SOA 40 depicts the optical attenuation characteristics.

A relation between the drive voltage and an extinction ratio of the SOA 40 is described (extinction ratio between the semiconductor optical amplifying gate switches). FIG. 10 depicts the relation between the drive voltage and the extinction ratio of the SOA 40. In the configuration of the matrix optical switch 24 (see FIG. 6), the input ports of the multiplexing couplers 40a to 40c are connected with the SOAs 40 of the same number, respectively. When one of the SOAs 40 connected with a certain multiplexing coupler is turned on, the rest of the SOAs 40 are turned off.

Even when the SOA 40 is turned off, some light leaks out of the SOA 40, and causes optical crosstalk at the multiplexing coupler. FIG. 10 depicts the optical crosstalk in graph form of the extinction ratio characteristics. For example, to set up the 8×8 matrix optical switch, the extinction ratio characteristics between on state and off state need to be approximately 58 dB (crosstalk occurs when the extinction ratio characteristics are more than or equal to 58 dB). To achieve the extinction ratio characteristics, the drive current of the SOA 40 which is turned off needs to be set at 0.65 V or less (the extinction ratio becomes 58 dB or more when the drive current is set at 0.65 V or less).

An example circuit of the drive circuit 45 depicted in FIG. 7 is described. FIG. 11 depicts the example circuit of the conventional drive circuit 45. AS depicted in FIG. 11, the drive circuit 45 includes the resistors R51 to R53, operational amplifiers OP51 to OP53, buffers BUF51 and BUF52, an inverter INV51, transistors (high-speed transistors) FET51 and FET52, and parasitic inductances L51 and L52.

In FIG. 11, $V_{SET1}$ represents direct current source, $V_{CONT}$ represents control signal voltage, $V_1$ represents output voltage of the operational amplifier OP51, $V_{OUT}$ represents coupled voltage of transistors FET51 and FET52, $V_{cc}$ represents +5 V of voltage source, $V_{ee}$ represents −5 V of voltage source, $V_{dd}$ represents 1.5 V of voltage source, $V_{SOA}$ represents anode voltage, and $I_{SOA}$ represents current of the SOA.

The operational amplifier OP51 includes a non-inverting amplifying circuit. The operational amplifier OP51 is a high-speed operational amplifier which has an output current capacity of 300 mA or more, about a band of 1 GHz, about a slew rate of 5000 V/μs, and a settling time of about 2 ns.

The direct current source $V_{SET1}$ at 0.825 V is arranged at an input terminal of the operational amplifier OP51. The operational amplifier OP51 amplifies the voltage of $V_{SET1}$ UP to 1.65 V ($V_1$ becomes 1.65 V). The drain of the transistor FET51 is connected with the output of the operational amplifier OP51.

The transistors FET51 and FET52 are high-speed transistors. The drain of the transistor FET51 is connected with the output of the operational amplifier OP51, and the source of the transistor FET51 is connected with the drain of the transistor FET52. Further, the drain of the transistor FET52 is connected with the source of the transistor FET51, and the source of the transistor FET51 is connected with ground.

Further, a connection point of the transistors FET51 and FET52 is connected with the SOA 40 (semiconductor amplifying gate switch module) via the inductances L51 and L52. The parasitic inductance L51 is in transmission line of a substrate from the connection point to the SOA 40, and the parasitic inductance L52 is in the transmission line inside the SOA 40.

CONT (control signal) turns the SOA 40 on or off. The buffer BUF52 has delay characteristics similarly to the inverter INV.

The operational amplifiers OP52 and OP53 are FET driving comparator amplifiers which drive the transistors FET51 and FET52. The operational amplifiers OP52 and OP53 have performance similar to that of the operational amplifier OP51.

When the control signal CONT is set at a HIGH level, the transistor FERT51 is turned on, and the transistor FET52 is turned on. When the transistor FET51 is turned on and the transistor FET52 is turned off, the output voltage of the operational amplifier OP51 is supplied for the SOA 40 via the transistor FET51 and the parasitic inductances L51 and L52 (the SOA 40 is turned on).

The transistor FET51 has an internal resistance of 0.5 Ω. Thus, when a current of 300 mA is applied, voltage drops by 0.15 V. Due to the voltage drop, $V_{OUT}$ is set at 1.5 V.

On the other hand, when the control signal CONT is set at a LOW level, the transistor FET51 is turned off, and the transistor FET52 is turned on. When transistor FET51 is turned off, and the transistor FET52 is turned on, $V_{OUT}$ is set at a ground-level voltage. Accordingly, current is not supplied for the SOA 40, and the SOA 40 is turned off.

There has been disclosed technology in Japanese Laid-open Patent Publication No. 2000-261508 in which feedback resistance is provided in a termination circuit using an operational amplifier to reduce power consumption and suppress reflection at a termination of a signal line, whereby errors are prevented.

In the conventional technology described above, however, ringing in the trailing edge and the rising edge cannot be suppressed, and thus the optical switch cannot be speeded up.

The ringing in the drive circuit 45 is described. FIG. 12 depicts an illustration of the ringing of the conventional drive circuit 45. In FIG. 12, $V_{OUT}$ represents a source voltage waveform of the transistor FET41, $V_{SOA}$ represents an anode voltage waveform of the SOA 40, $I_{SOA}$ represents a current waveform of the SOA 40 (FIG. 12 depicts the voltage waveform in "V", and the current waveform in "A").

The waveforms in FIG. 12 have ringing in the trailing edge. The ringing occurs when electric charge stored in junction capacitance (about 70 pF) of the SOA 40 is electrically discharged. Due to the ringing in the trailing edge, $V_{SOA}$ goes over 0.65 V. Accordingly, the extinction ratio of the SOA 40 becomes 58 dB or less, whereby the optical signal is affected. It takes about 5.2 ns to pass through the trailing edge including the ringing, whereby the optical switch cannot be speeded up.

On the other hand, the rising edge of $V_{OUT}$ causes the ringing of $I_{SOA}$, and accordingly, causes the ringing of optical output of the SOA 40. An optical surge is thus caused, which may degenerate the optical transceiver. Further, the ringing causes noise on the main signal where the light overlays, whereby errors may arise. Further, it takes about 14 ns for the waveform of the ringing to return to normal, whereby speed of the rising edge becomes slow.

SUMMARY

According to an aspect of the invention, a drive circuit includes a first transistor that is controlled to be in on or off state in response to a control signal, and outputs, in on state, a positive current which is input from a first operational amplifier connected with a drain of the first transistor to a semiconductor optical amplifier; a second transistor that is connected with a source of the first transistor, and is in inverse on or off state to the state of the first transistor; and a negative voltage circuit that is connected to a source of the second transistor, and outputs, when the second transistor is in on state, a negative current to the semiconductor optical amplifier.

The drive circuit may be an optical switch.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWING(S)

DESCRIPTION OF EMBODIMENT(S)

Preferred embodiments of the present invention will be explained with reference to accompanying drawings.

Descriptions of an optical packet switching system, configuration of core nodes, an operation of an SOA, relation between drive current and optical gain of the SOA, relation between drive voltage and the optical again of the SOA, and relation between the drive voltage and an extinction ratio of the SOA are consistent with the descriptions above in FIGS. 3 to 10, and thus omitted.

Figure 1:
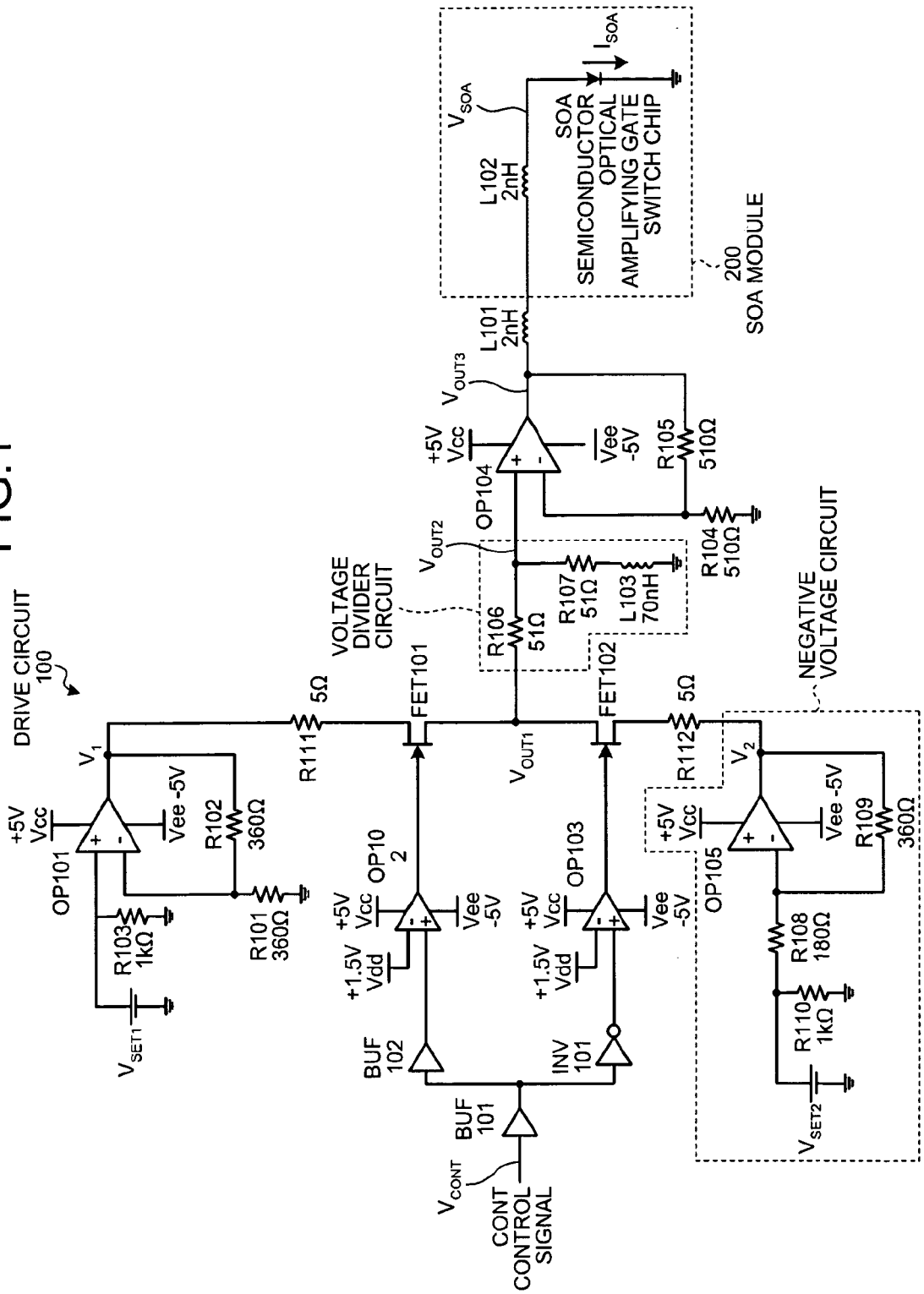
FIG. 1 depicts a circuit diagram of a drive circuit and an SOA module according to the present invention.

FIG. 1 depicts a circuit diagram of a drive circuit 100, and an SOA module 200 according to the present invention. The SOA module 200 corresponds to the SOA 40 depicted in FIG. 7 and other figures. As depicted in FIG. 1, the drive circuit 100 includes the resistors R101 to R112, operational amplifiers OP101 to 105, buffers BUF101 and BUF102, an inverter INV101, transistors (high-speed transistors) FET101 and FET102, parasitic inductances L101 to L102, and an inductor L103.

In FIG. 1, $V_{SET1}$ and $V_{SET2}$ represent direct current sources, $V_{CONT}$ represents control signal voltage for applying a control signal, $V_1$ represents output voltage of the operational amplifier OP101, $V_2$ represents output voltage of the operational amplifier OP102, $V_{OUT1}$ represents coupled voltage of the transistors FET101 and FET102, $V_{OUT2}$ represents input voltage of the operational amplifier OP104 (divided voltage of voltage divider circuit, and the voltage dividing circuit are described later), $V_{OUT3}$ represents output voltage of the operational amplifier OP104, $V_{cc}$ represents +5 V of voltage source, $V_{ee}$ represents −5 V of voltage source, $V_{dd}$ represents 1.5 V of voltage source, $V_{SOA}$ represents anode voltage of the SOA module 200, and $I_{SOA}$ represents current of the SOA module 200.

The resistors R101 to R112 are resistance units. The resistor R101 has a resistance of 360 Ω, the resistor R102 has a resistance of 360 Ω, the resistor R103 has a resistance of 1 kΩ, the resistor R104 has a resistance of 510 Ω, the resistor R105 has a resistance of 510 Ω, the resistor R106 has a resistance of 51 Ω, the resistor R107 has a resistance of 51 Ω, the resistor R108 has a resistance of 180 Ω, the resistor R109 has a resistance of 360 Ω, the resistor R110 has a resistance of 1 kΩ, the resistor R111 has a resistance of 5 Ω, and the resistor R112 has a resistance of 5 Ω.

As depicted in FIG. 1, the resistor R111 is arranged between the operational amplifier OP101 and the transistor FET101 to thereby offset fluctuation of the waveform of current in a rising edge which arises in a transmission line connecting the operational amplifier OP101 and the transistor FET101.

The transistor R112 is arranged between the operational amplifier OP105 and the transistor FET102 to thereby offset the fluctuation of the waveform of current in the rising edge which arises in the transmission line between the operational amplifier OP105 and the transistor FET102. As described above, with the resistors R111 and R112 arranged, the fluctuation of the waveform of current in the rising edge can be offset, whereby the SOA module 200 can speed up a switch switching process.

The operational amplifier OP101 includes a non-inverting amplifying circuit. The operational amplifier OP101 is connected to the direct current source $V_{SET1}$ which supplies about 0.79 V. The voltage of $V_{SET1}$ is amplified into about 1.58 V by the operational amplifier OP101. The output of the operational amplifier OP101 is connected, via the resistor R111, with the drain of the transistor FET101.

The operational amplifiers OP102 and OP103 are amplifiers for driving the transistors FET101 and FET102. The operational amplifiers OP102 and OP103 have performance similar to that of the operational amplifier OP101. The operational amplifier OP104 has an output current capacity of 300 mA, about a band of 1 GHz, about a slew rate of 5000 V/μs, and a settling time of about 2 ns.

The operational amplifier OP105 is an amplifier for inverting and amplifying a voltage of 0.79 V set in $V_{SET2}$ to generate negative potential. The voltage of $V_{SET2}$ is inverted and amplified to about −1.58 V by the operational amplifier OP105. The output of the operational amplifier OP105 is connected, via the resistor R112, with the source of the transistor FET102.

The output of the operational amplifier OP105, which has a negative potential, is connected, via the resistor R112, with the source of the transistor FET102. Thus, when the SOA module is turned off (when the transistor FET101 is turned off, and the transistor FET102 is turned on), the negative potential (which attracts $V_{SOA}$) suppresses the ringing in the trailing edge of $V_{SOA}$, and shortens time it takes to pass through the trailing edge (time it takes for $V_{SOA}$ to become 0.65 V or less).

The transistors FET101 and FET102 are high-speed transistors. The drain of the transistor FET101 is connected, via the resistor R111, with the output of the operational amplifier OP101. The source of the transistor FET101 is connected with the drain of the transistor FET102.

The source of the transistor FET102 is connected, via the resistor R112, with the output of the operational amplifier OP105. The source of the transistor FET102 is connected with a negative voltage circuit.

The voltage divider circuit including the resistor R106, the resistor R107, and the inductor L103 (70 nH) is connected between a connection point of the transistors FET101 and FET102 and the ground. When the transistor FET102 is turned on, and the transistor FET101 is turned off, about a negative voltage of −1.5 V is supplied for $V_{OUT1}$.

When $V_{OUT1}$ has a negative voltage of about −1.5 V, the divided voltage $V_{OUT2}$ of the voltage divider circuit becomes about −0.75 V. The divided voltage $V_{OUT2}$ is amplified two times by the operational amplifier OP104, and a negative voltage of −1.5 V is supplied for $V_{SOA}$.

On the other hand, when the transistor FET is turned on, and the transistor FET102 is turned off, the divided voltage $V_{OUT2}$ becomes about 0.75 V. Compared with combined resistance of the resistor R106 and the resistor R107, an internal resistance of the transistor FET101 (about 0.5 Ω) and a resistance of the resistor R111 are so small that voltage drop caused by the transistor FET101 and the resistor R111 is neglected. The voltage $V_{OUT2}$ (about 0.75 V) is amplified two times by the operational amplifier OP104, and thus $V_{OUT3}$ becomes 1.5 V.

The output voltage $V_{OUT3}$ of the operational amplifier OP104 is supplied, via the parasitic inductances L101 and L102, for the SOA module 200. The parasitic inductance L101 is arranged in the transmission line of a substrate from the output terminal of the operational amplifier OP104 to the SOA module 200. The parasitic inductance L102 is arranged in the transmission line inside the SOA module 200.

CONT (control signal) is a controls signal for turning the SOA module 200 on or off. The inverter INV101 inverts a signal. The buffer BUF102 has delay characteristics similar to that of the inverter INV.

When the control signal CONT is set at the HIGH level, the transistor FET101 is turned on and the transistor FET102 is turned off. When the transistor FET101 is turned on and the transistor FET102 is turned off, the output voltage of the operational amplifier OP101 is supplied for the SOA module 200 via the transistor FET101, the parasitic inductances L101 and L102, and the like (the SOA 200 is turned on).

On the other hand, when the control signal CONT is set at the LOW level, the transistor FET101 is turned off and the transistor FET102 is turned on. When the transistor FET101 is turned off and the transistor FET102 is turned on, a negative voltage of −1.5 V is supplied for $V_{OUT1}$, and the SOA module 200 is turned off. The negative voltage of −1.5 V suppresses the ringing in the trailing edge of $V_{SOA}$.

Figure 2:
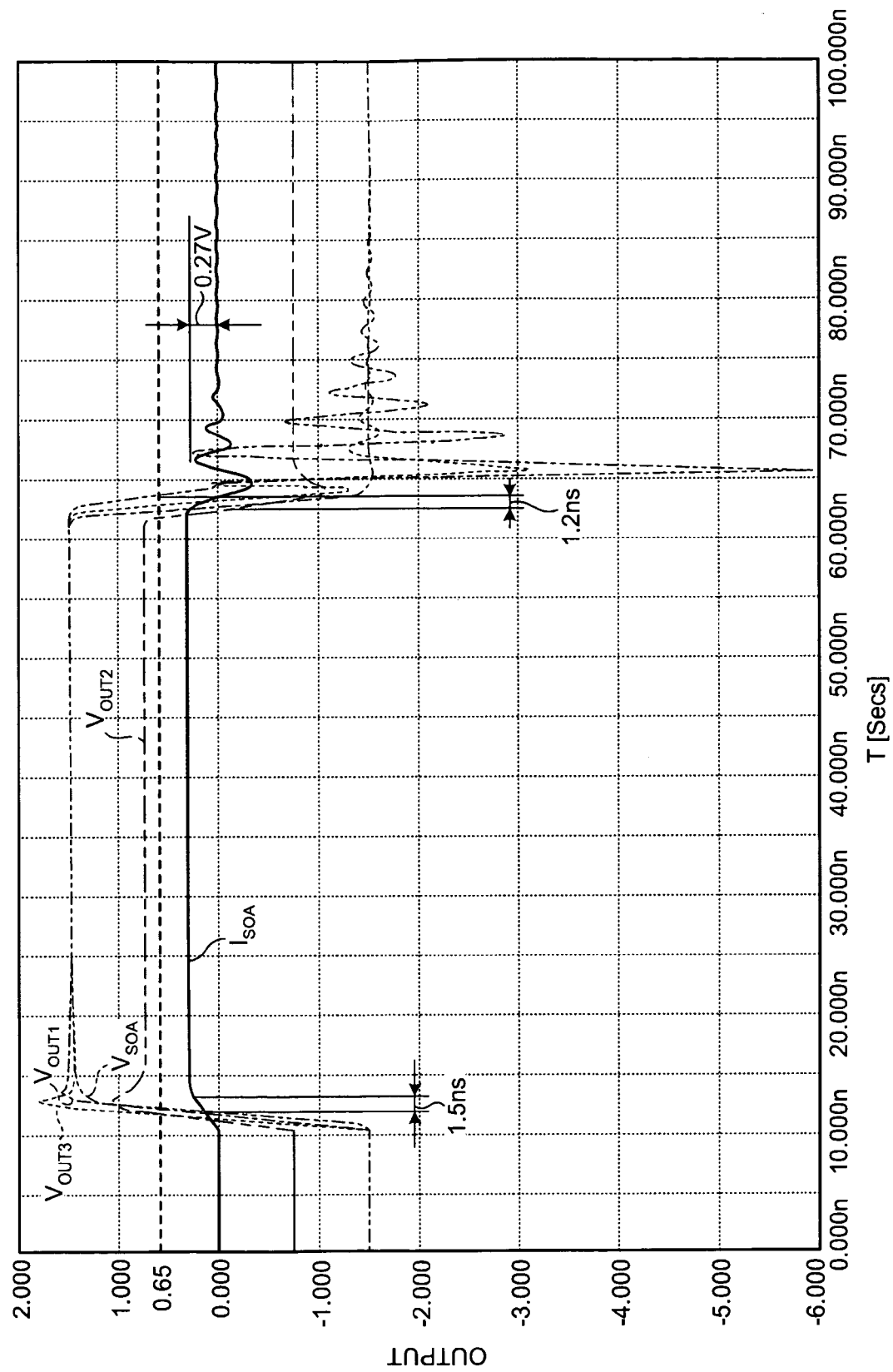
FIG. 2 depicts an illustration of ringing of the drive circuit according to an embodiment.
Figure 3:
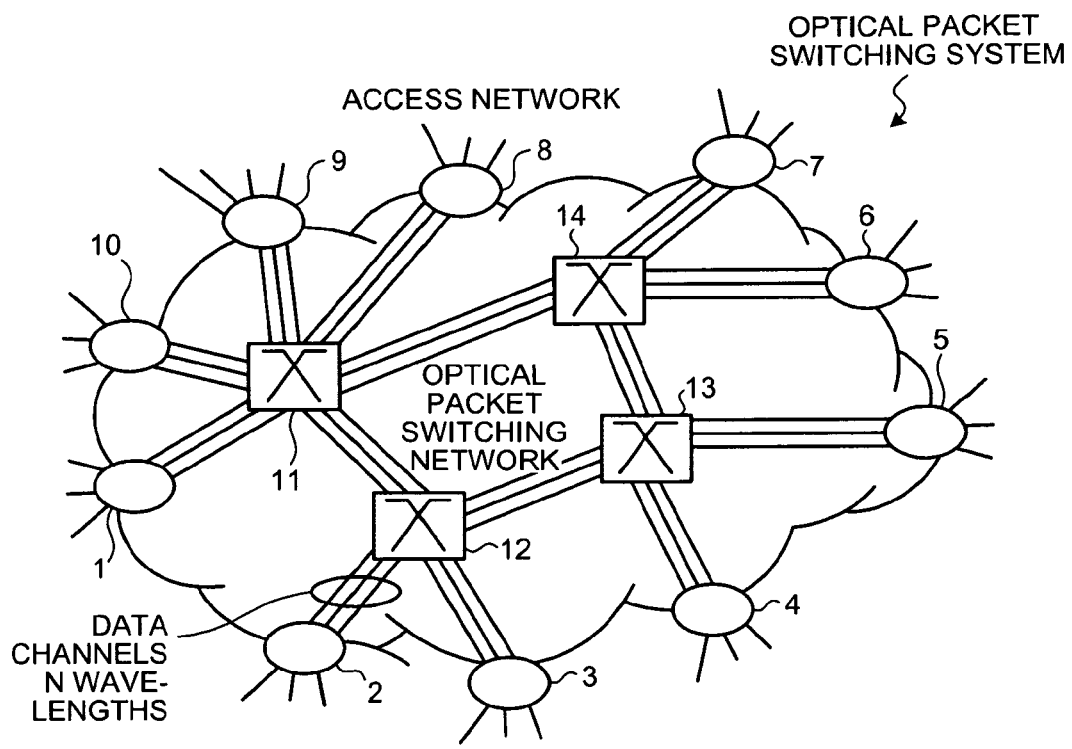
FIG. 3 depicts an illustration of an optical packet switching system.
Figure 4:
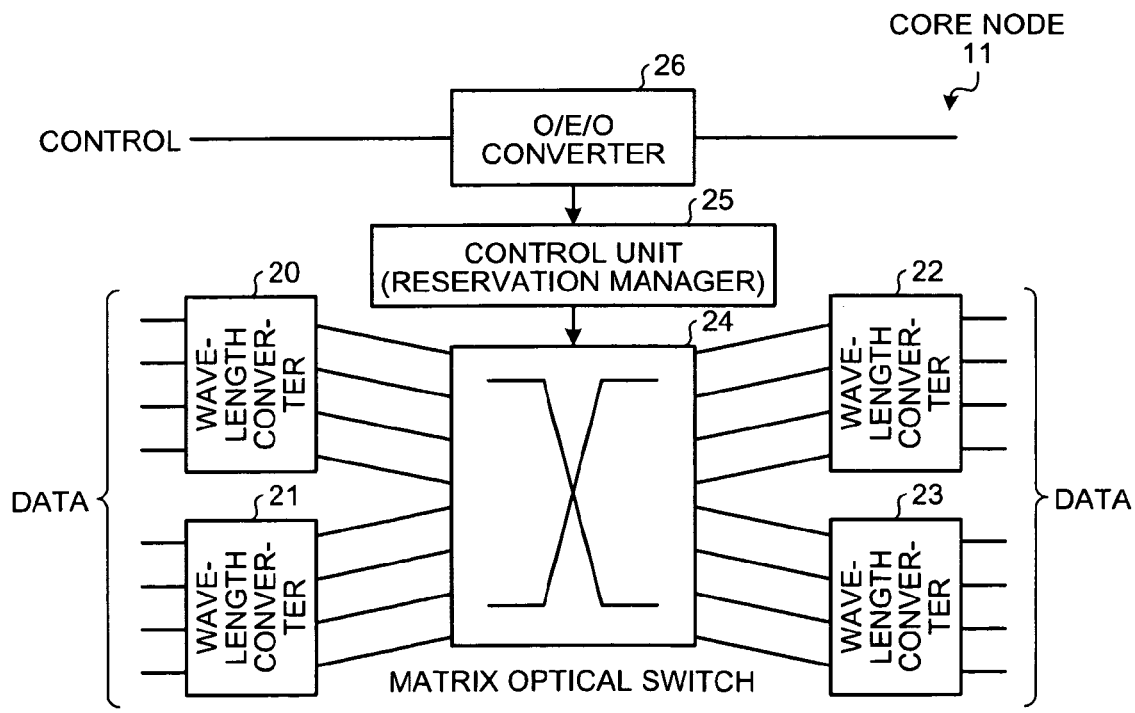
FIG. 4 depicts a functional block diagram of configuration of a conventional core node.
Figure 5:
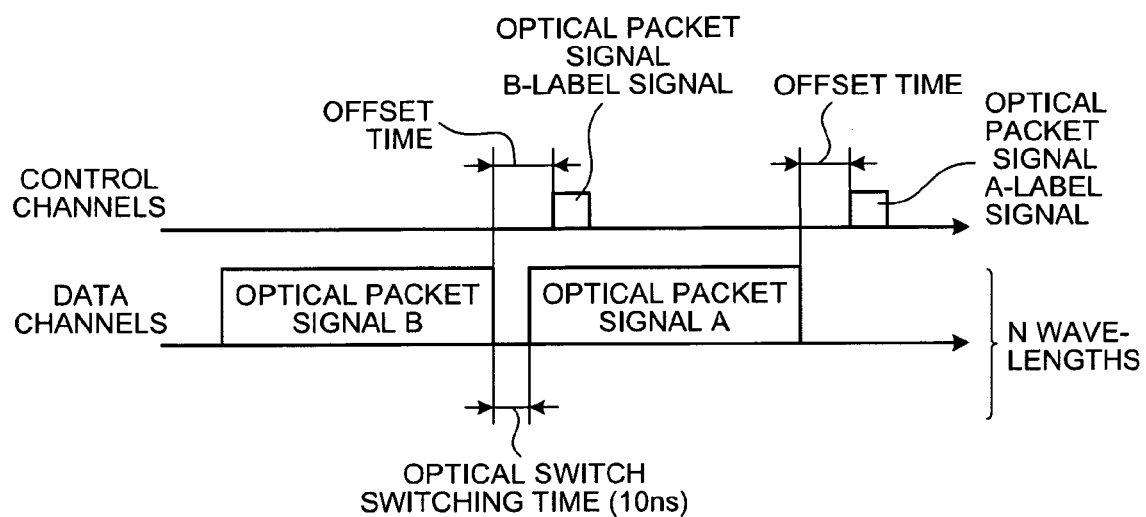
FIG. 5 depicts an illustration of switching timing of an optical packet signal.
Figure 6:
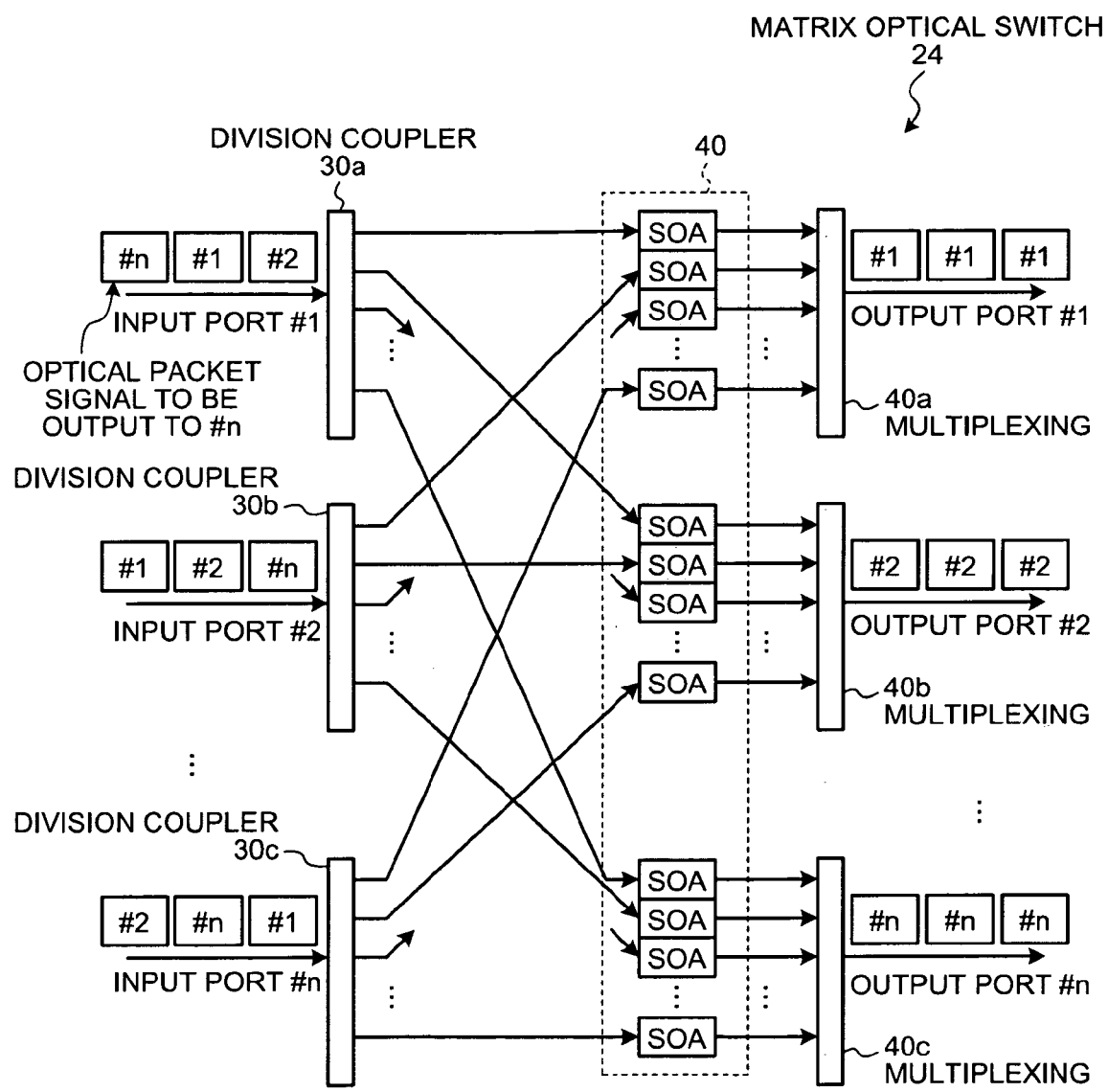
FIG. 6 depicts configuration of a conventional matrix optical switch.
Figure 7:
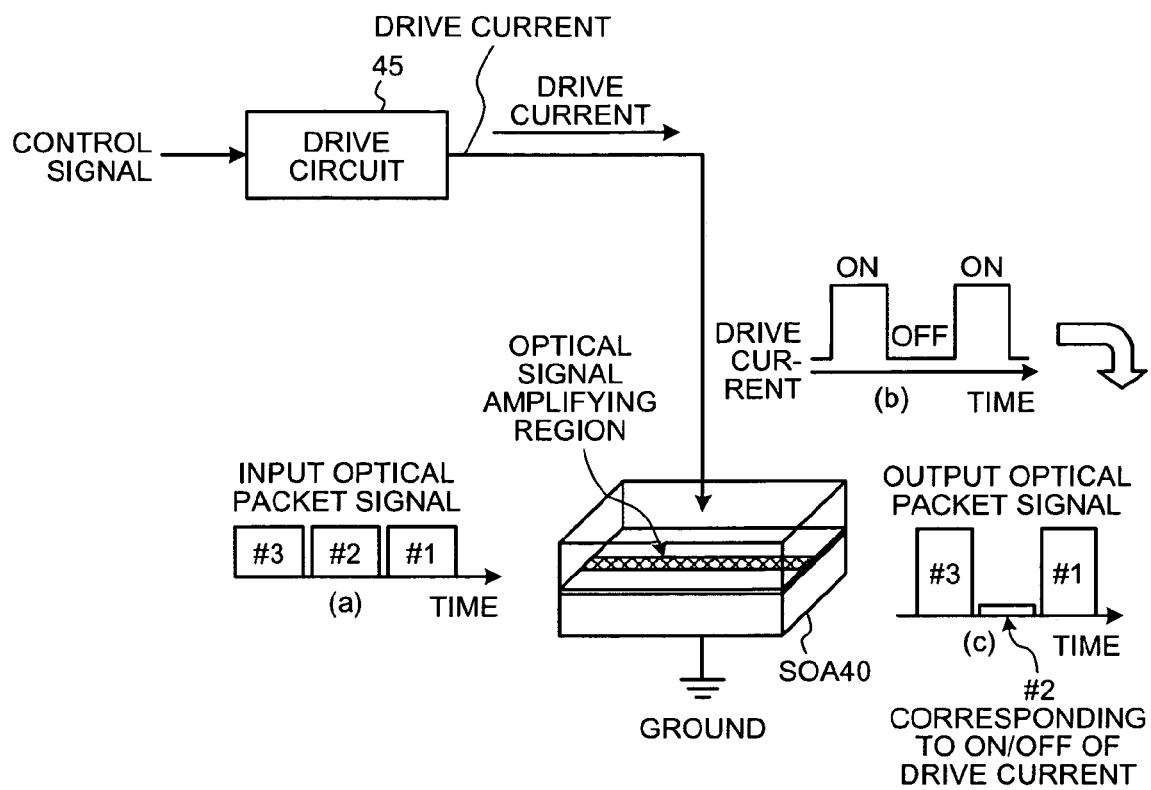
FIG. 7 depicts an illustration of an operation of an SOA.
Figure 8:
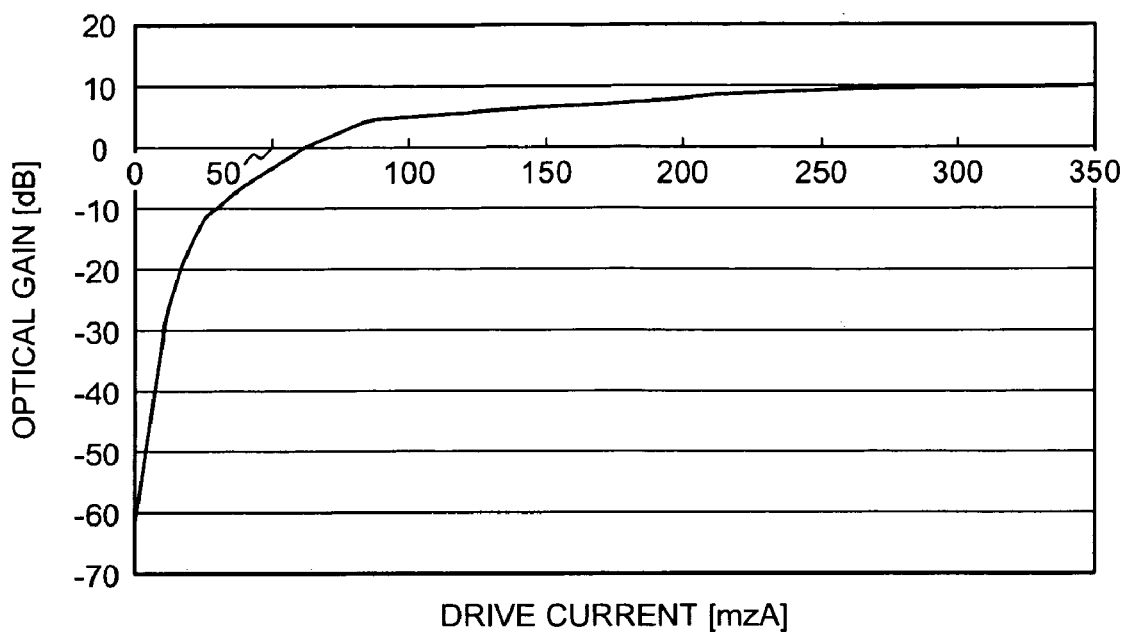
FIG. 8 depicts relation between drive current and optical gain of the SOA.
Figure 9:
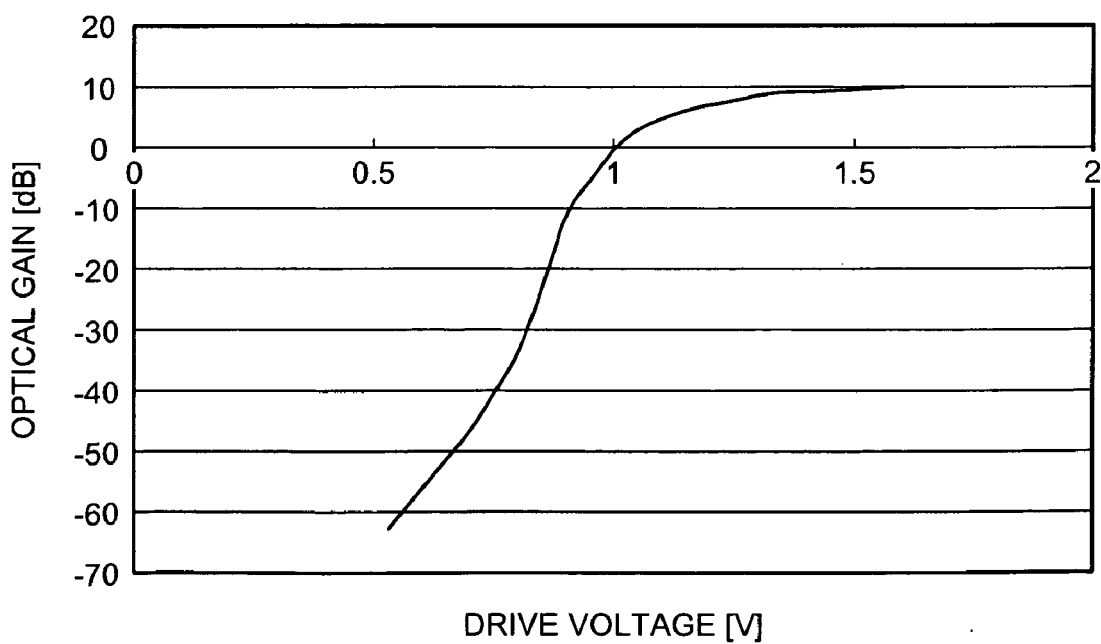
FIG. 9 depicts relation between drive voltage and optical again of the SOA.
Figure 10:
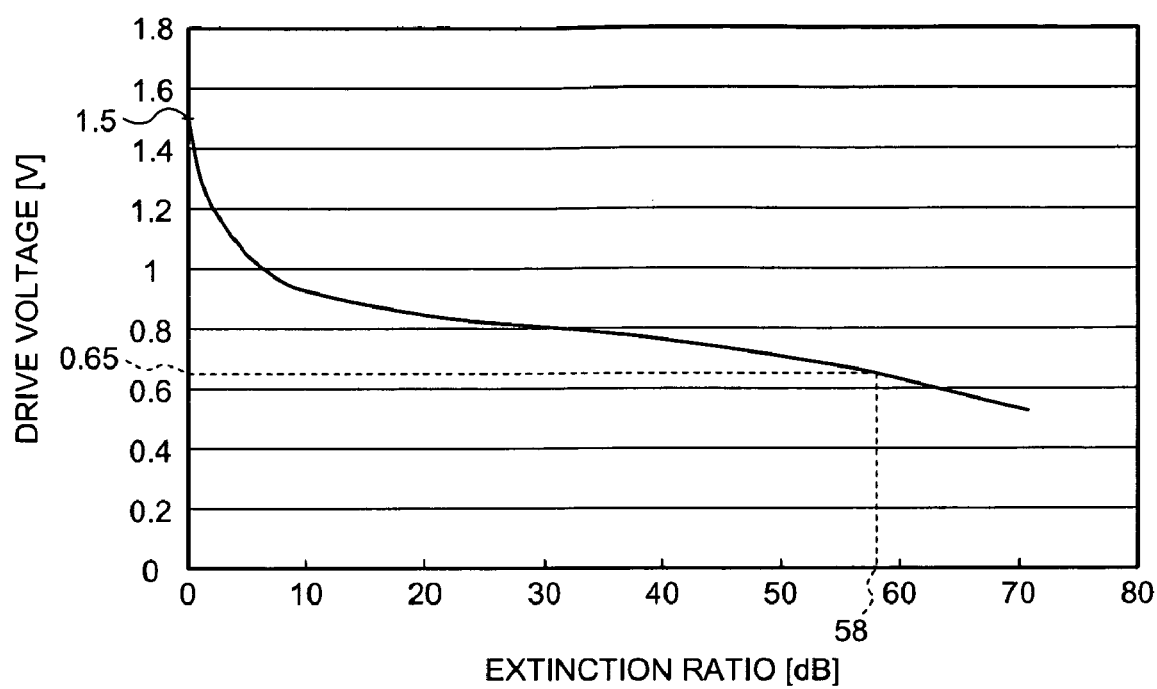
FIG. 10 depicts relation between drive voltage and an extinction ratio of the SOA.
Figure 11:
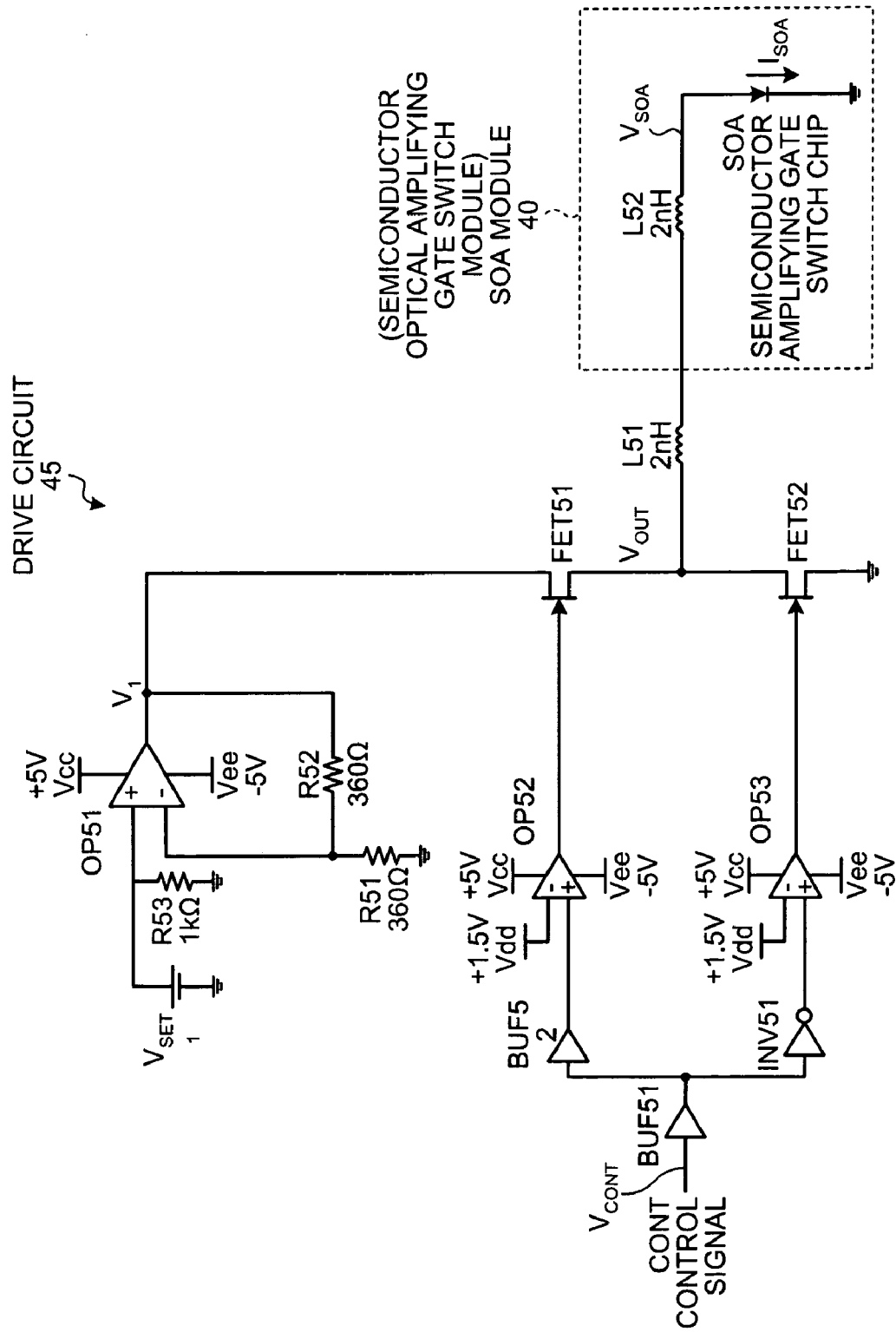
FIG. 11 depicts an example circuit of a conventional drive circuit.
Figure 12:
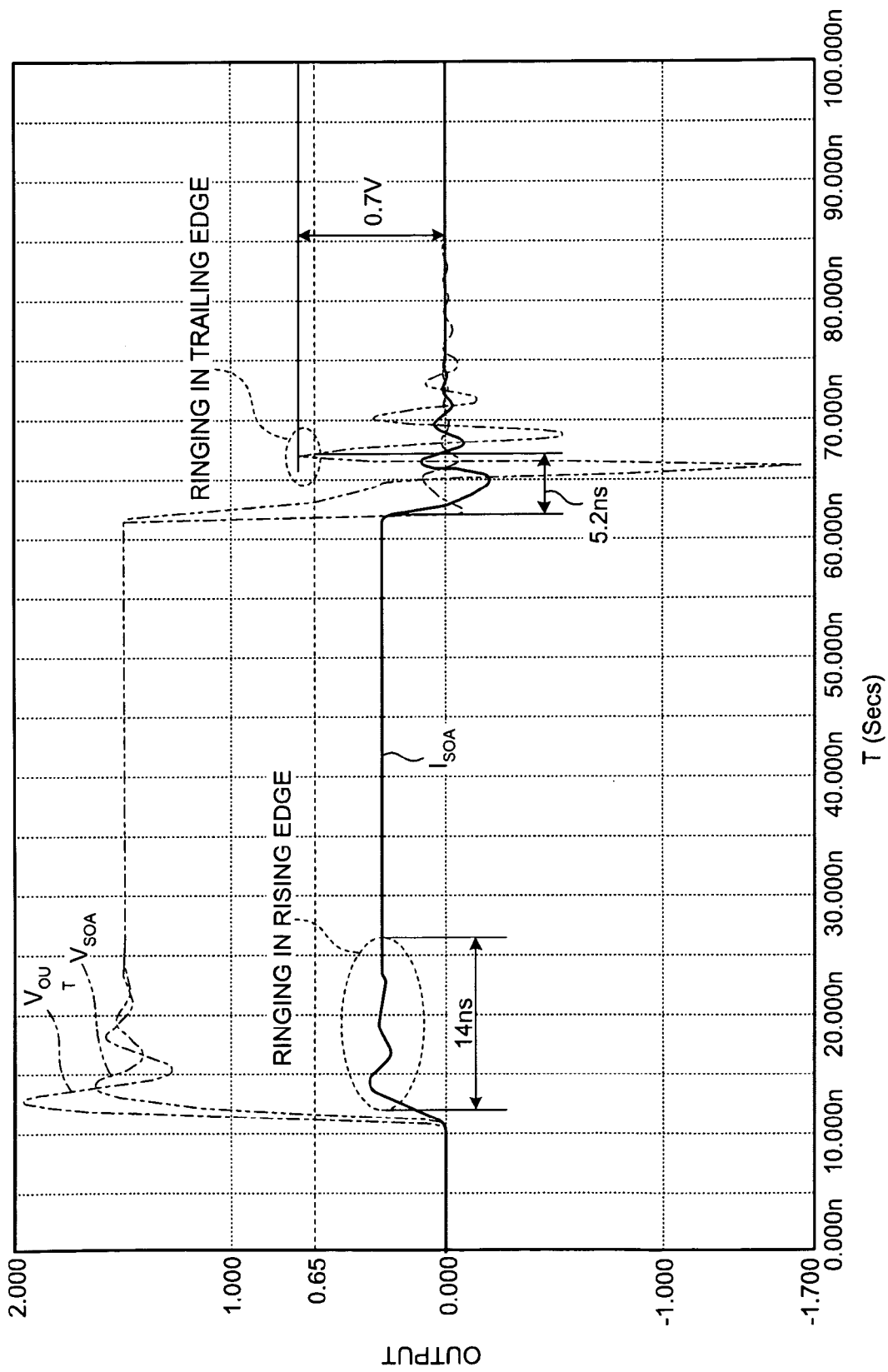
FIG. 12 depicts an illustration of ringing of the conventional drive circuit.

FIG. 2 depicts an illustration of the ringing of the drive circuit 100 according to the present invention. To begin with, when FIG. 2 is compared with FIG. 12, the waveform of $V_{OUT1}$ in FIG. 2 is more stable and has a faster rising edge than the waveform of $V_{OUT}$ of the conventional art.

The conventional drive circuit 45 has load which is caused on the parasitic inductances L51 and L52 and the SOA which has parasitic capacity. The drive circuit 100 according to the present invention has, however, load which is caused on the resistor R106, the resistor R107, and the inductor L103 which have a high impedance.

Further, electric potential of $V_{OUT1}$ changes from −1.5 V to +1.5 V in a short amount of time. Then, the electric potential is reflected due to the high impedance components, and sharply overshoots by a great amount. The overshoot (intensified part) upgrades the operational amplifier OP104 in higher speed and wider band.

The upgrade of the operational amplifier OP104 in higher speed and wider band generates an intensified waveform of output of the operational amplifier OP104. Compared with a time constant (about 3 ns) of the circuit including the parasitic inductances L101, 102, and the SOA module 200, the intensified waveform is so short that the voltage waveform and the current waveform of the SOA are speeded up. As a result, the ringing in the rising edge in the conventional art can be suppressed.

The anode electric potential of the SOA module 200 transitions from a negative electric potential to a positive electric potential with great amplitude. The increase of a rising rate per unit of time in the electric potential shortens time it takes for $I_{SOA}$ to reach desired current. In the example depicted in FIG. 2, it takes about 1.5 ns for $I_{SOA}$ of the SOA module 200 to pass through the rising edge.

Further, when the SOA module 200 is turned off, the electric potential of $V_{SOA}$ becomes negative due to the negative voltage circuit (the negative voltage circuit includes the resistors R108 to R110, and the operational amplifier OP105).

Since the electric potential of $V_{SOA}$ becomes negative, $V_{SOA}$ of the SOA module 200 is 0.65 V or less even with the ringing in the trailing edge (because the extinction ratio is 58 db or more), whereby the optical signal is not affected anymore.

In the example depicted in FIG. 2, the ringing in the trailing edge of $V_{SOA}$ is suppressed and peaks at about 0.27 V, and it takes about 1.2 ns for $V_{SOA}$ to pass through the trailing edge. Further, the $V_{SOA}$ decreases to be negative with the great amplitude in the trailing edge, whereby the SOA module 200 is speeded up.

As described above, in the drive circuit 100 according to the present embodiment, the negative voltage circuit including the resistors R108 to R110 and the operational amplifier OP105 is connected with the source of the transistor FET102. When the transistor FET101 is turned off and the transistor FET102 is turned on (when the SOA module is turned off), the negative voltage circuit outputs a negative current to the SOA module 200, whereby the ringing in the trailing edge can be suppressed at 0.65 V or less. As a result, the SOA module 200 can be speeded up.

Further, in the drive circuit 100 according to the present embodiment, the resistor R111 is arranged between the operational amplifier OP101 and the transistor FET101, and the transistor R112 is arranged between the operational amplifier OP105 and the transistor FET102, whereby the fluctuation of the waveform of current in the rising edge which arises in the transmission line can be offset. As a result, the SOA module 200 can speed up the switch switching process.

Further, the drive circuit 100 according to the present embodiment includes the negative voltage circuit, and the voltage divider circuit which is arranged between the transistor FET101 and the SOA module 200, whereby the amount of time for the rising edge can be shortened.

Further, in the drive circuit 100 according to the present embodiment, the transistor FET101 requires a smaller amount of current, whereby a small current capacity between the drain and the source is required, and the transistor FET101 device can be downsized.

The drive circuit depicted in FIG. 1 is an embodiment of the drive circuit according to the present invention. The drive circuit according to the present invention does not necessarily require the same configuration depicted in FIG. 1.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A drive circuit comprising:
a first transistor that is controlled to be in on or off state in response to a control signal, and outputs, in on state, a positive current which is input from a first operational amplifier connected with a drain of the first transistor to a semiconductor optical amplifier;
a second transistor that is connected with a source of the first transistor, and is in inverse on or off state to the state of the first transistor; and
a negative voltage circuit that is connected to a source of the second transistor, and outputs, when the second transistor is in on state, a negative current to the semiconductor optical amplifier.

2. The drive circuit according to claim 1, wherein the negative voltage circuit includes a second operational amplifier that amplifies an output of a direct current source to output a negative voltage.

3. The drive circuit according to claim 1, further comprising:
a first resistor that is arranged in a transmission line connecting the first operational amplifier and the first transistor together; and
a second resistor that is arranged in a transmission line connecting the negative voltage circuit and the second transistor together.

4. The drive circuit according to claim 1, further comprising a voltage divider circuit that is arranged between the first transistor and the semiconductor optical amplifier, and has a predetermined impedance component.

5. An optical switch comprising:
a first transistor that is controlled to be in on or off state in response to a control signal, and outputs, in on state, a positive current which is input from a first operational amplifier connected with a drain of the first transistor to a semiconductor optical amplifier;
a second transistor that is connected with a source of the first transistor, and is in inverse on or off state to the state of the first transistor; and
a negative voltage circuit that is connected to a source of the second transistor, and outputs, when the second transistor is in on state, a negative current to the semiconductor optical amplifier.

6. The optical switch according to claim 5, wherein the negative voltage circuit includes a second operational amplifier that amplifies an output of a direct current source to output a negative voltage.

7. The optical switch according to claim 5, further comprising:
a first resistor that is arranged in a transmission line connecting the first operational amplifier and the first transistor together; and
a second resistor that is arranged in a transmission line connecting the negative voltage circuit and the second transistor together.

8. The optical switch according to claim 5, further comprising a voltage divider circuit that is arranged between the first transistor and the semiconductor optical amplifier, and has a predetermined impedance component.

* * * * *